(12) United States Patent
Lingambudi et al.

(10) Patent No.: US 7,979,823 B2
(45) Date of Patent: Jul. 12, 2011

(54) IDENTIFICATION OF VOLTAGE REFERENCE ERRORS IN PCB DESIGNS

(75) Inventors: Anil Bindu Lingambudi, Karnataka (IN); Saravanan Sethuraman, Bangalore (IN); Anandavally Sreekala, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/193,119

(22) Filed: Aug. 18, 2008

(65) Prior Publication Data
US 2010/0042961 A1 Feb. 18, 2010

(51) Int. Cl.
*G06F 17/50* (2006.01)
(52) U.S. Cl. .......................... 716/106; 716/111; 716/137
(58) Field of Classification Search ................ 716/5, 15, 716/100, 106, 111, 137
See application file for complete search history.

(56) References Cited

U.S. PATENT DOCUMENTS

| 6,976,233 B1 | 12/2005 | Frank et al. |
| 6,993,739 B2 | 1/2006 | Becker et al. |
| 7,170,361 B1 | 1/2007 | Farnworth |

OTHER PUBLICATIONS

Zhen MU, "Meeting EMI Requirements in High Speed Board Designs with Allegro PCB SI", Technical Paper, pp. 1-9, (2002, Cadence Design Systems, Inc.).
http://www.radio-electronics.com/info/electronics-design/pcb/signal-integrity.php, "Signal Integrity—an overview the methods used during PCB and circuit design to ensure signal integrity", pp. 1-6.

*Primary Examiner* — Sun J Lin
(74) *Attorney, Agent, or Firm* — Sprusons and Ferguson; Grant A. Johnson

(57) ABSTRACT

Disclosed is a computer implemented method for determining a voltage reference error in a PCB design comprising receiving information about said PCB design, identifying a signal associated with said design, receiving one or more user defined voltage references for said signal, and comparing the user defined voltage reference to the voltages of the power planes adjacent to said signal.

6 Claims, 7 Drawing Sheets

| Sl no | Layer | Surface type | Material | Width (mils) | Single-ended Impedance | Coupling type | Spacing (mils) | Differential Impedance |
|---|---|---|---|---|---|---|---|---|
| 1 | Top | Conductor | Copper Foil | 6.00 | 50Ohm | | 12.00 | 100Ohm |
| | | Dielectric | FR4 | | | | | |
| 2 | Plane1 | Plane | Copper | | | | | |
| | | Dielectric | FR4 | | | | | |
| 3 | Sig1 | Conductor | Copper | 4.00 | 50Ohm | EDGE | 8.00 | 100Ohm |
| | | Dielectric | FR4 | | | | | |
| 4 | Plane2 | Plane | Copper | | | | | |
| | | Dielectric | FR4 | | | | | |
| 5 | Plane3 | Plane | Copper | | | | | |
| | | Dielectric | FR4 | | | | | |
| 6 | Sig2 | Conductor | Copper | 4.00 | 50Ohm | EDGE | 8.00 | 100Ohm |
| | | Dielectric | FR4 | | | | | |
| 7 | Plane4 | Plane | Copper | | | | | |
| | | Dielectric | FR4 | | | | | |
| 8 | Bottom | Conductor | Copper Foil | 6.00 | 50Ohm | | 12.00 | 100Ohm |

Figure 5

| Sl no | Signal Name | Ref Plane 1 | Ref Plane 2 |
|---|---|---|---|
| 1 | PCIE_TX_0 | GND | GND |
| 2 | PCIE_TX_1 | GND | GND |
| 3 | PCIE_RX_0 | GND | GND |
| 4 | PCIE_RX_1 | GND | GND |
| 5 | EBC_DATA00 | 3.3V | GND |
| 6 | EBC_DATA01 | 3.3V | GND |
| 7 | SDRAM0_DATA0 | GND | 1.8V |
| 8 | SDRAM0_DATA1 | GND | 1.8V |

GND
1.2V
1.5V
1.8V
2.5V
3.3V
5.0V

Continue

Cancel

Figure 6

```
                        ERROR REPORT
   SAVE    |  REFRESH  |  CANCEL  |  PRINT  |  SEARCH Ne  |  CLOSE
  *~ ~ ~ ~ ~ ~ ~ ~ ~ ~ ~ ~ ~ ~ ~ ~ ~ ~ ~ ~ ~ ~ ~ ~ ~ ~ ~*
  *                                                      *
  *       Improper voltage referening ERROR Report       *
  *                                                      *
  *       File name    : test123.brd                     *
  *       Date         : 08 AUG 2006                     *
  *       Time         : 14:00:00 (GMT +530HRS)          *
  *                                                      *
  *~ ~ ~ ~ ~ ~ ~ ~ ~ ~ ~ ~ ~ ~ ~ ~ ~ ~ ~ ~ ~ ~ ~ ~ ~ ~ ~*

Total no of ERRORS : 26 signals

1. Improper referencing of signal "abcd" @ ( location ) in layers ( Sig1...Sig2)
2. Improper referencing of signal "abcd" @ ( location ) in layers ( Sig1...Sig2)
3. Improper referencing of signal "abcd" @ ( location ) in layers ( Sig1...Sig2)
 .
 .
 .
 .
 .
26. Improper referencing of signal "abcd" @ ( location ) in layers ( Sig1...Sig2)
```

Figure 7

IDENTIFICATION OF VOLTAGE REFERENCE ERRORS IN PCB DESIGNS

FIELD OF THE INVENTION

This disclosure relates generally to printed circuit board (PCB) design, and more particularly, to identifying voltage referencing errors of a PCB design.

BACKGROUND

As PCBs increase in complexity it is important to reduce the number of possible errors during the design phase. Completing a sound design will reduce signal integrity issues at a later stage.

An important aspect of PCB board design is signal return current flow, especially for high frequency signals. Signal currents take the path of least resistance which is typically the closest power plane. Therefore, when a signal changes from one layer to another on a PCB, the return current path is interrupted and the return current must also change reference planes, typically via a decoupling capacitor.

In PCB design, improper referencing of signals generates noise, bit errors, reflection and crosstalk. Proper referencing is essential for proper impedance control, loop area minimisation and cross talk reduction. In mixed signal design, proper referencing is essential to prevent analogue and digital signal interference.

A need therefore exists for a method to detect voltage reference errors, for example when a high speed signal is referenced to an improper voltage.

SUMMARY

One embodiment of the disclosure is a method for determining a voltage reference error in a PCB design. A signal is identified from information about a PCB design. A user defines one or more voltage references for the signal. The user defined voltages are compared to the voltages of one or more power planes adjacent to the signal. If a user defined voltage differs from the associated voltage reference of an adjacent plane, an indication that a voltage referencing error has occurred is generated.

A further embodiment of the disclosure is a system for determining a voltage reference error in a PCB design. A processor identifies a signal associated with a PCB design from information about the PCB design. One or more user defined voltage references for the signal is input via an input device. The processor compares the user defined voltages to the voltages of one or more adjacent power planes. If a user defined voltage differs from the associated voltage reference of an adjacent plane, the processor generates an indication that a voltage referencing error has occurred.

DESCRIPTION OF THE DRAWINGS

One or more embodiments of the disclosure will now be described with reference to the drawings in which:

FIG. 5 shows an example of the stackup matrix;

FIG. 6 shows an example of a screen shot in which the user defines the voltage reference signals for a set of signals in the PCB design; and FIG. 7 shows an example of a screen shot that is displayed to the user upon completion of the analysis.

DETAILED DESCRIPTION

Figure 1:
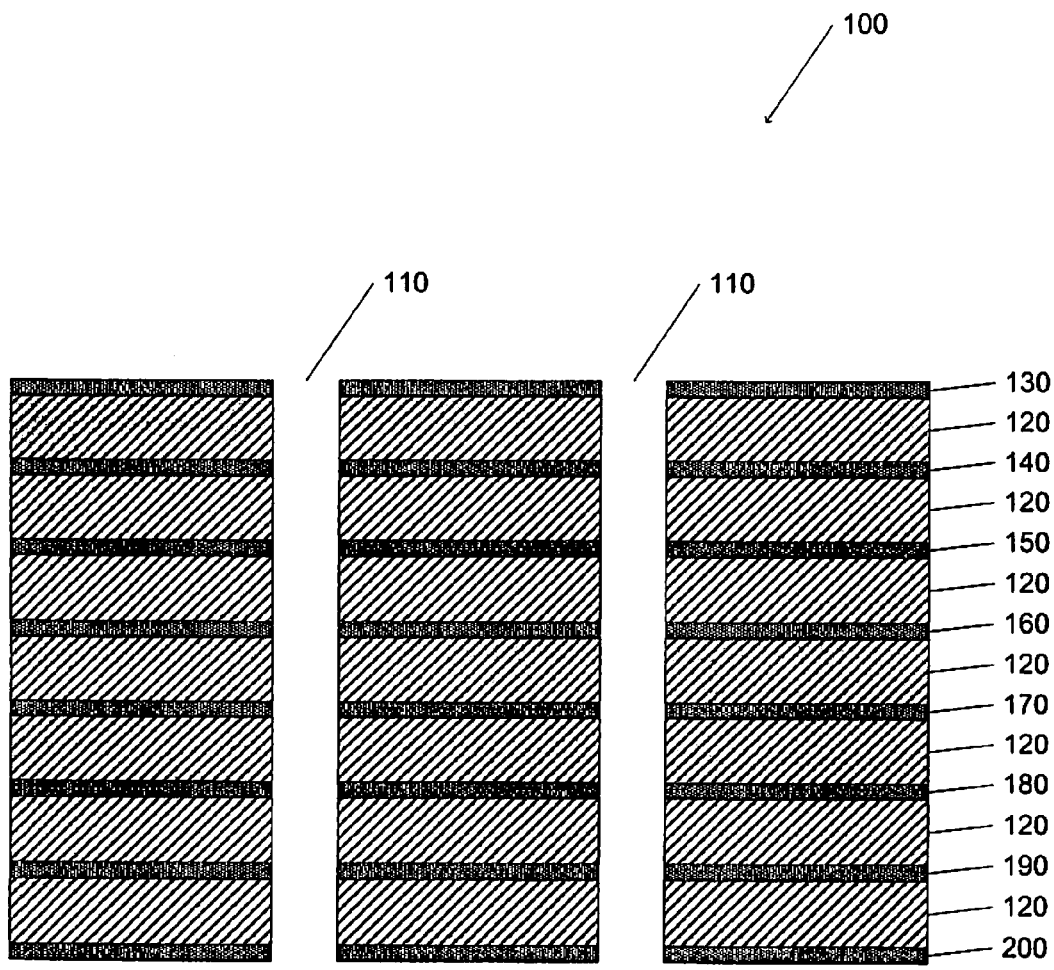
FIG. 1 shows the cross section of a typical PCB board.

FIG. 1 shows a cross section of a typical PCB board 100. The PCB consists of a plurality of power plane and signal layers separated by dielectric material 120 and through hole vias 110. In this example, the PCB consists of signal layers 150 and 180, ground power planes 140 and 170, a +3.3V power plane layer 160, and a +1.8V power plane 190.

As is typical in the art, signals are routed throughout the PCB, crossing signal layers if required. To ensure design integrity, each signal must be referenced to the correct reference power planes. An incorrectly referenced signal may create signal integrity issues. For example, a signal on signal layer 150 may be correctly referenced to the +3.3V power plane 160 and the ground power plane 140. However, for example, if the signal is routed to signal layer 180, the voltage reference for the signal may be incorrectly assigned to the +1.8V power plane 190.

Figure 2A:
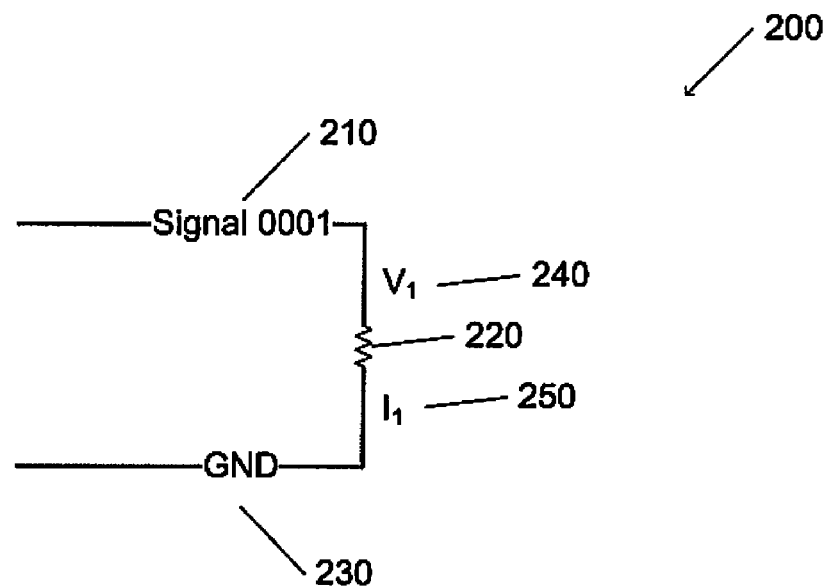
FIGS. 2a and 2b illustrates an exemplary embodiment of a typical signal circuit.
Figure 2B:
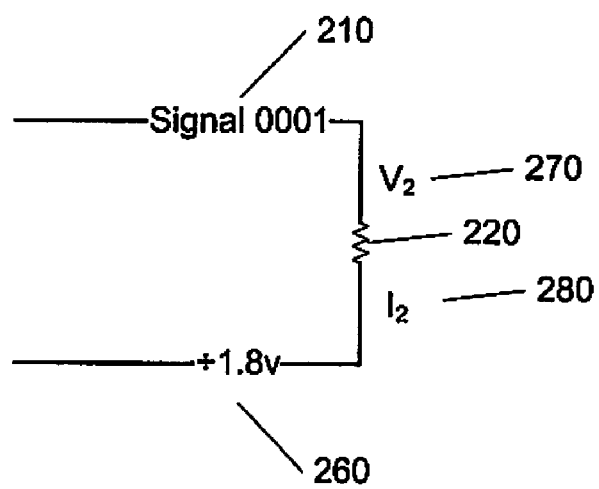

FIG. 2a illustrates an exemplary embodiment of a typical signal circuit 200. In this example, a signal 210 is routed on signal layer 150. The signal creates a voltage $V_1$ 240 across a load 220 and a return signal current $I_1$ 250. The ground voltage reference 230 for this signal is assigned correctly as GND. Accordingly, the signal voltage $V_1$ 240 and return current $I_1$ 250 are correct. However, FIG. 2b, in the case where a voltage reference error occurs, the signal 210 ground voltage reference may be assigned incorrectly as +1.8V. Accordingly, the signal voltage $V_2$ 270 and return current $I_2$ 280 will be incorrect.

Figure 3:
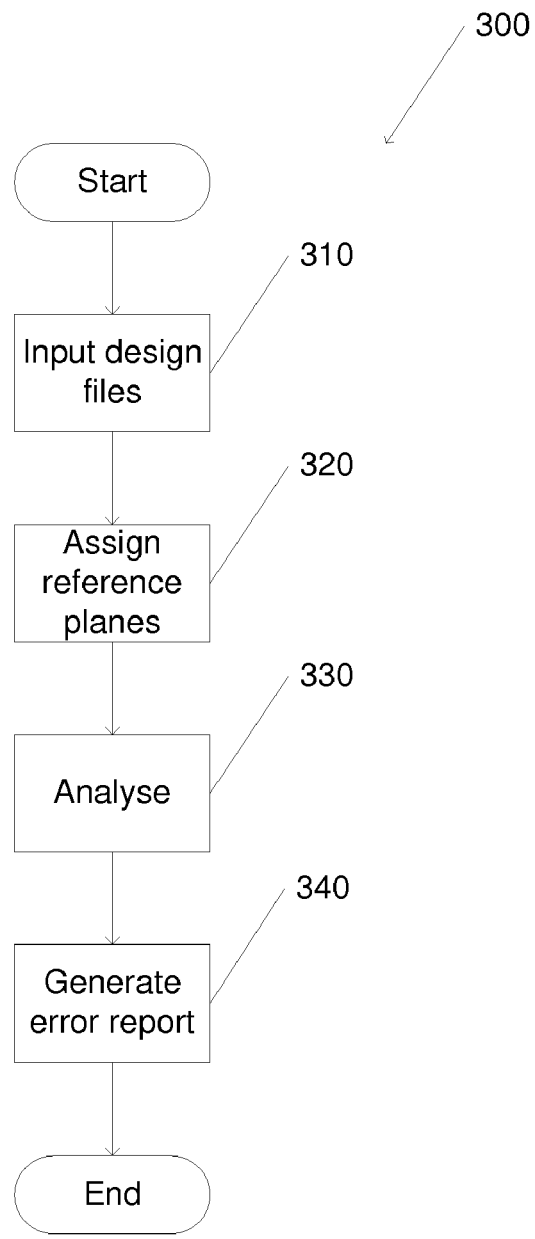
FIG. 3 shows a method used to identify voltage referencing errors at design time.
Figure 4:
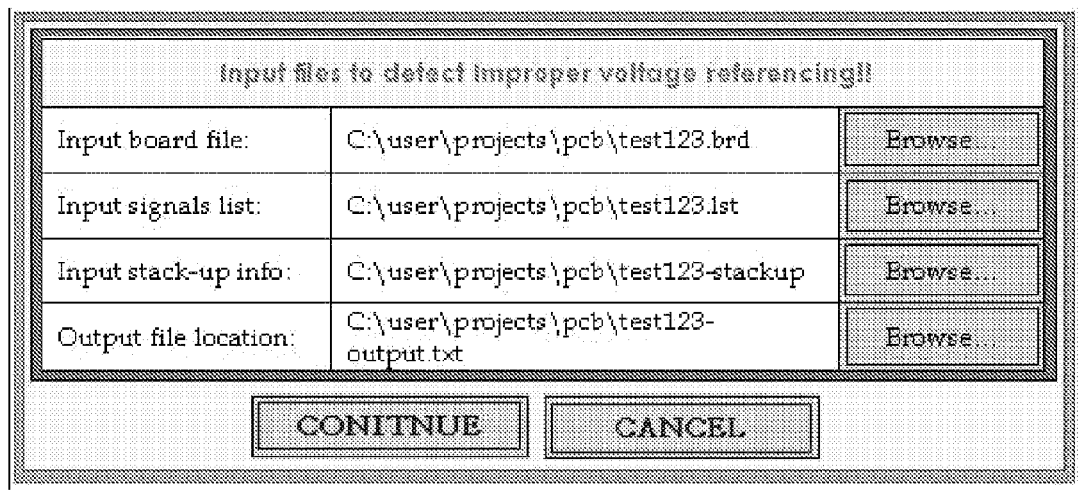
FIG. 4 shows an example of a screen shot in which the user has identified a set of design files that define the PCB design.

FIG. 3 shows a method 300 for identifying voltage referencing errors at design time. The method 300 begins at step 310 when a PCB design is input. Typically, the design files of a PCB design software package are input. FIG. 4 shows an example of a screen shot of a computer implemented method of method 300 according to one aspect of the disclosure. The user inputs a set of design files that define the PCB design. In this example, a board file specifying the board dimensions, a signal file specifying the signals and a stackup file specifying the board stackup are used to define the PCB design. Optionally, the user is able to specify a file to which the error report is to be written.

FIG. 5 shows an example of the stackup matrix generated according to one aspect of the present invention. The stackup matrix is generated from the PCB design information.

Reference is now made to FIG. 3, where in step 320 of method 300, the signals of the PCB are identified from the PCB design. Additional information such as the X and Y coordinates and layer information of the signals are also identified. The user defines the voltage references for these signals contained in the PCB design. Typically, the user would define two voltage references, but any number of voltage references can be defined. Typically, the user would only specify the voltage references for the most critical signals, but has the option to define voltage references for all of the signals of the board.

FIG. 6 shows an example of a screen shot according to one aspect of the present invention. The user implements step 320 of method 300 by defining voltage reference signals for a set of signals identified from the PCB design.

Reference is now made to FIG. 3, where in step 330 of method 300, the set of user defined voltage references are compared to the corresponding voltage references of the PCB design. Typically in PCB design, signals are routed on signal layers between power planes. In these situations, the voltage references of a signal can be verified by comparing the voltages of the adjacent power planes. For instance, the user would typically define two voltage references which would be compared to the voltages assigned to the two adjacent power planes. A difference between the user defined voltage and the voltage assigned to a power plane would indicate a voltage referencing error. Additionally, as the signal location is known from the PCB design information, the X an Y coordinates of the voltage referencing error can be calculated.

In step 340 of method 300, an error report is generated and displayed to the user in accordance with one aspect of the present invention. The error report indicates those signals of the PCB design for which voltage references have been incorrectly assigned. In addition to this information, the X and Y coordinates of the location and layer of the incorrectly assigned voltage references are calculated. The user then has the option to use the PCB design software to correct the errors and run steps 310 to 340 of method 300 iteratively until no voltage reference errors exist. The steps of method 300 can be performed on hardware, software or a combination of both FIG. 7 shows an example of a screen shot according to one aspect of the present invention that is displayed to the user in step 340.

We claim:

1. A method for determining a voltage reference error in a PCB design comprising:
   receiving information about the PCB design;
   identifying a signal associated with the PCB design;
   receiving from a user via a user interface one or more user defined voltage references for the signal;
   comparing the one or more user defined voltage references to one or more voltages of one or more power planes adjacent to the signal; and
   generating an indication that indicates a voltage referencing error exists when the one or more user defined voltages differ from the corresponding one or more voltages of the one or more power planes adjacent to said signal; and
   displaying the indication to the user via the user interface.

2. The method according to claim 1, further comprises computing a location of the signal for which the indication that indicates a voltage referencing error exists.

3. The method according to claim 1, wherein the signal is a high frequency signal.

4. A system for determining a voltage reference error in a PCB design comprising:
   an input device; and
   a processor;
      wherein information about the PCB design is received by the processor;
      the processor configured to identify a signal associated with the PCB design;
      one or more user defined voltage references for the signal are input via the input device;
      the processor configured to compute a difference between the one or more user defined voltage references and one or more voltages of one or more power planes adjacent to the signal; and
      an indication that indicates a voltage referencing error exists is generated by the processor when the processor computes that the one or more user defined voltages differ from the corresponding one or more voltages of the one or more power planes adjacent to the signal.

5. The system according to claim 4, wherein the processor is configured to compute a location of the signal for which an indication that indicates a voltage referencing error exists.

6. The system according to claim 4, wherein the signal is a high frequency signal.

* * * * *